United States Patent
Tateishi

(10) Patent No.: US 7,095,060 B2
(45) Date of Patent: Aug. 22, 2006

(54) UNIT FOR DRIVING LIGHT-EMITTING DEVICE

(75) Inventor: Kiyoshi Tateishi, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 141 days.

(21) Appl. No.: 10/429,525

(22) Filed: May 5, 2003

(65) Prior Publication Data

US 2004/0004227 A1  Jan. 8, 2004

(30) Foreign Application Priority Data

Jul. 4, 2002  (JP) .............................. 2002-196381

(51) Int. Cl.
*H01L 29/22* (2006.01)
*H01L 29/267* (2006.01)

(52) U.S. Cl. .............................. 257/99; 257/81; 257/83; 257/84; 257/431; 257/433; 257/E31.052; 257/E31.053; 257/E31.076

(58) Field of Classification Search ................ 257/290, 257/778, 774, 779, 99, 780, 784, 737, 431, 257/81, 84, 83, 433, E31.052, E31.053, E31.076
See application file for complete search history.

(56) References Cited

U.S. PATENT DOCUMENTS

| | | | | |
|---|---|---|---|---|
| 5,347,162 | A * | 9/1994 | Pasch ........................... | 257/773 |
| 5,805,422 | A * | 9/1998 | Otake et al. ................. | 361/749 |
| 5,866,948 | A * | 2/1999 | Murakami et al. ........... | 257/778 |
| 6,712,529 | B1 * | 3/2004 | Horio ........................... | 385/92 |
| 2001/0042639 | A1 * | 11/2001 | Higashida et al. ........... | 174/260 |
| 2002/0153831 | A1 * | 10/2002 | Sakakura et al. ........... | 313/504 |

\* cited by examiner

*Primary Examiner*—Jerome Jackson
*Assistant Examiner*—Joseph Nguyen
(74) *Attorney, Agent, or Firm*—Perman & Green, LLP

(57) ABSTRACT

A unit according to the present invention includes a substrate and an IC chip used for driving a light-emitting device. A relay terminal is provided at a region spaced from peripheral areas of the substrate so as to connect the light-emitting device with the IC chip. The relay terminal is connected with a corresponding terminal of the IC chip via a connecting channel such as wire-bonding. The light-emitting device is supported by the substrate such that a terminal of the light-emitting device is electrically connected with the relay terminal. A length of a wiring line between the light-emitting device for an optical pick-up and the unit used for driving the light-emitting device is decreased.

9 Claims, 4 Drawing Sheets

UNIT FOR DRIVING LIGHT-EMITTING DEVICE

BACKGROUND OF THE INVENTION

1) Field of the Invention

The present invention relates to a unit which drives a light-emitting device as a light source such as a laser diode, wherein the device is used for an optical pick-up of an optical disk player.

2) Description of the Related Art

Fabrication of a light-emitting device applicable to an optical pick-up is usually separated from that of a driving unit used for driving the light-emitting device. Therefore, a procedure to electrically connect the light-emitting device with an output terminal of the driving unit is necessary in order to form a light-emitting apparatus.

When, for example, a laser diode is used as the light-emitting device, as shown in FIG. 1 of the attached drawings, a light-emitting device 2 that is sealed in a can package is connected with a unit 5 used for driving the light-emitting device via wiring lines 4 provided on a flexible printed wiring board 3, so that the device is flexibly positioned.

It is necessary to quickly power on and off the light-emitting device, i.e., the laser light source, because recording information at a high speed and at a high density is required for optical recording mediums such as a recordable optical disk and a rewritable optical disk in recent years.

However, because the wiring lines between the light-emitting device and the unit on the flexible printed wiring board behaves as a distributed-constant circuit in the light-emitting apparatus, ringing is caused by a high-speed switching over an electrical current. The ringing is a phenomenon that the electrical current supplied to the light-emitting device is unstable during the switching. As a result, a noise is generated in an optical pulse from the light-emitting device.

SUMMARY OF THE INVENTION

According to one aspect of the present invention, there is provided a unit for driving a light-emitting device including, a substrate, an IC chip supported on the substrate so as to drive the light-emitting device, a relay terminal provided at a region spaced from peripheral areas of the substrate to relay a driving current to the light-emitting device, and a connecting channel which connects the relay terminal with an output terminal for the driving current of the IC chip, wherein the substrate includes a supporting region which supports the light-emitting device in the vicinity of the relay terminal.

The length of a wiring line between the light-emitting device and the unit used for driving the light-emitting device is decreased by above unit, so that an interconnection with lower impedance can be realized.

DETAILED DESCRIPTION OF THE INVENTION

Embodiments of the present invention will be described in detail with reference to the attached drawings.

Figure 2:
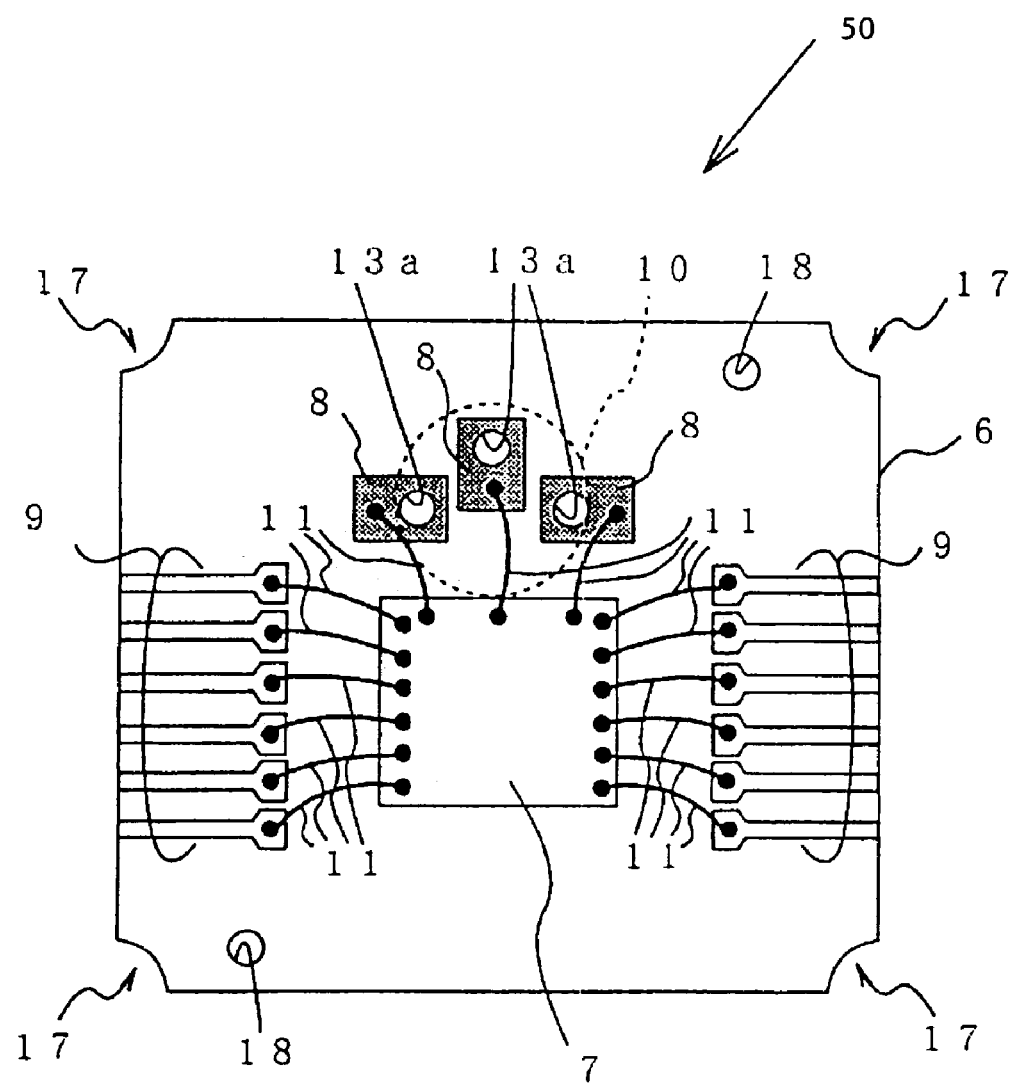
FIG. 2 is a top view of a unit used for driving a light-emitting device according to one embodiment of the present invention.

Referring to FIG. 2, in a unit 50 according to one embodiment of the invention, an IC chip 7 used for driving a light-emitting device 22 (FIG. 4) is supported by a substrate 6 at a supporting region 10 or at a region in the vicinity of the supporting region. An IC patterning circuit (not shown) is provided within the IC chip 7 in order to drive the light-emitting device 22. For example, a driving circuit for driving a blue-violet laser diode (not shown) having an emission wavelength at approximately 405 nm is included in the IC chip 7. Relay terminals 8 are formed at a supporting region 10 of the substrate 6 or in the vicinity of the supporting region except for peripheral areas of the substrate 6. The relay terminals 8 connect with terminals of the light-emitting device. Two groups of terminals 9 are provided at the peripheral areas of the substrate 6 for supplying electrical power, control commands and the like to the IC chip 7.

The relay terminals 8 and the groups of IC driving terminals 9 are formed on the substrate 6 by means of printing technique or the like. Wire-bonding 11 is used to electrically connect the IC chip 7 with the relay terminals 8 and the groups of IC driving terminals 9. Although wire-bonding 11 is used as a connecting channel for an electrical current in this embodiment, the channel is not limited to wiring-bonding. Alternative means such as flip chip bonding and TAB (Tape Automated Bonding) may be used wherein no thin metal wiring is employed.

Figure 3:
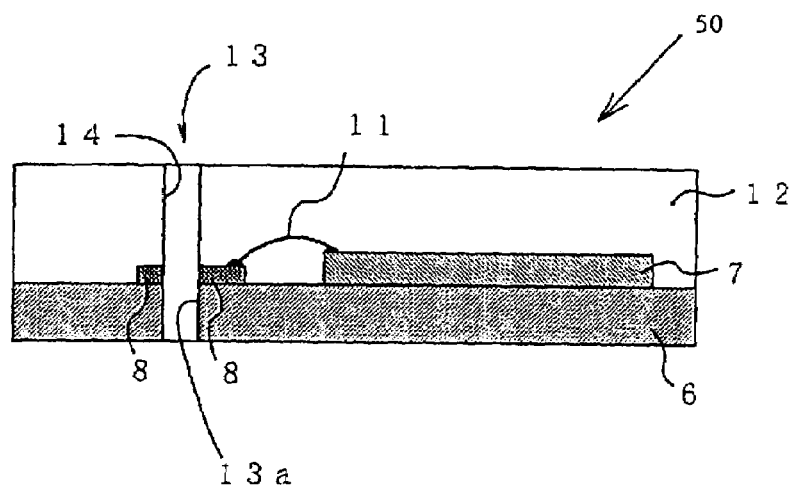
FIG. 3 is a cross-sectional view of the unit shown in FIG. 2.

As shown in FIG. 3, one surface of the substrate 6 whereon the IC chip 7 is mounted is sealed with a molded resin layer 12. A through hole 13 passes through the substrate 6 as well as the molded resin layer 12 at each relay terminal 8 itself or at a region in the vicinity of the relay terminal. A part of the relay terminal 8 is exposed on an inner wall 14 of the through hole 13. The size and shape of the through hole 13 is configured such that a terminal of the light-emitting device can be inserted. It should be noted that, as can be seen in FIG. 4, electrically conductive material may be further provided on the inner wall 14 of the through hole 13 so as to extend a portion of each relay terminal 8 along the inner wall 14.

The through hole 13 may be formed by the following procedure; holes 13a passing through the substrate 6 are formed in advance as shown in FIG. 2, a member (not shown) having appropriate shape and size is allocated on each of the holes 13a during a sealing process utilizing the molded resin layer 12, the resin sealing process is carried out, and the members are removed after finishing the sealing process.

Figure 1:
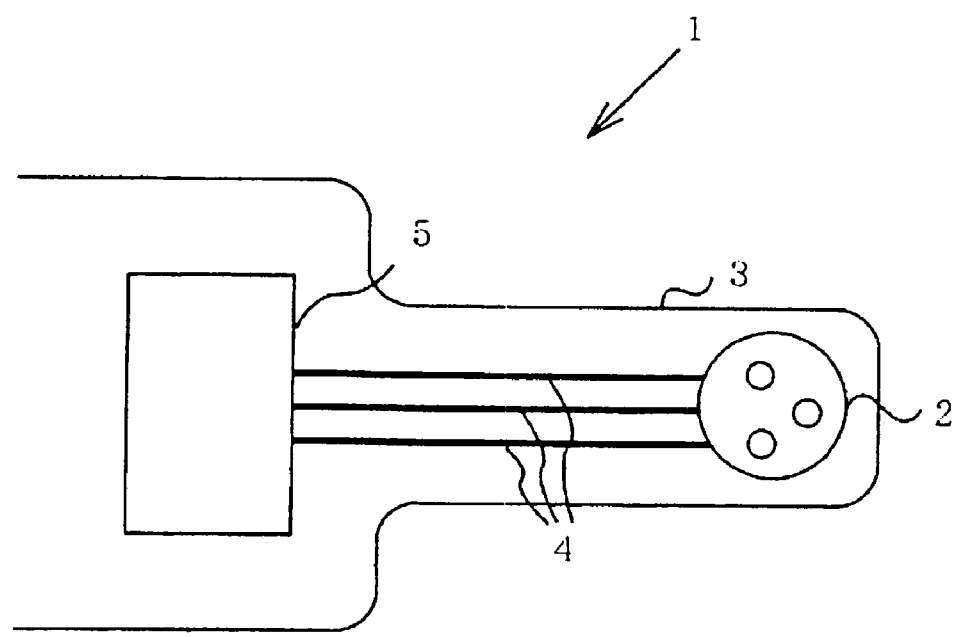
FIG. 1 is a top view of a light-emitting apparatus in a prior art.
Figure 4:
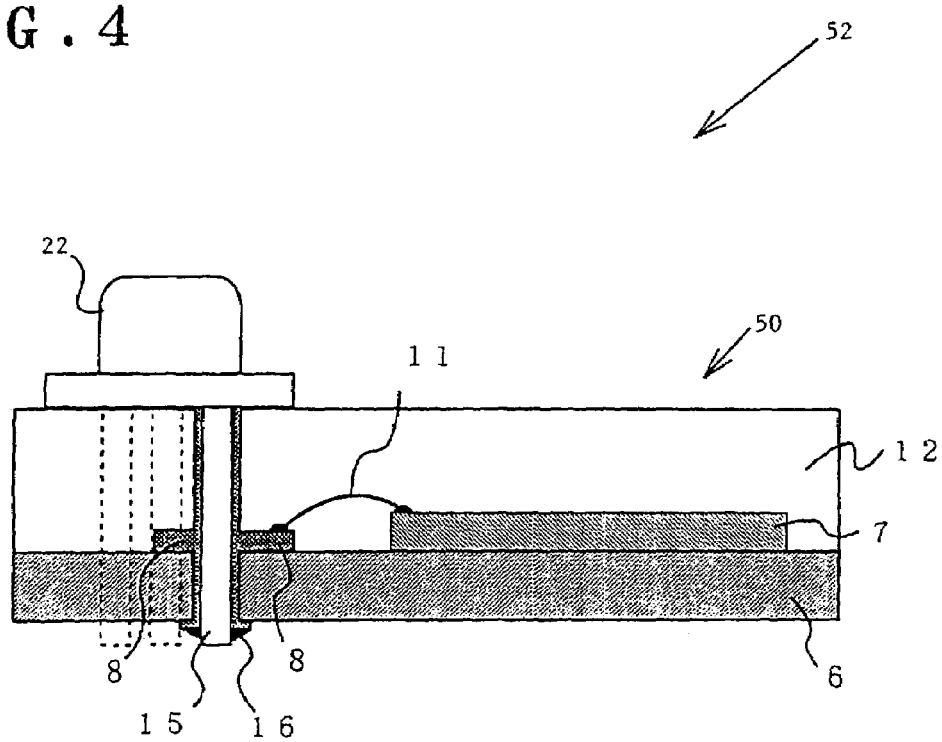
FIG. 4 is a cross-sectional view of the unit when a light-emitting device is provided thereon.

As shown in FIG. 4, the light-emitting device 22 is mounted on the unit 50 in order to form the light-emitting apparatus 52. It should be noted that the electrically conductive material of the relay terminal 8 is extended throughout the inner wall 14 of the through hole 13 in FIG. 4. In addition, a tip of the electrically conductive material is exposed on a surface of the substrate 6 for electrical connection as described below. Three terminals 15 of the light-emitting device 22 are inserted through the three through holes 13 of the unit 50 respectively and the terminals 15 are electrically connected with the relay terminals 8 by a solder 16, thereby forming the light-emitting apparatus 52. Such configuration permits an electrical connection between the light-emitting device 22 and the unit 50 without providing wiring lines 4 therebetween as shown in FIG. 1.

It should be noted that the number of relay terminals 8 depends on the number of terminals 15 of the light-emitting device 22.

The substrate 6 may be sealed by means of a transfer molding process in forming the unit 50. Both surfaces of the substrate 6 can be sealed with resin when the transfer molding process is applied. Alternatively, the substrate 6 may be sealed by means of a hermetic seal.

Position adjustment means may also be formed on the unit 50. Such position adjustment means are, for example, notches 17 provided at four corners of the substrate 6 as shown in FIG. 2. Location and size of the notches 17 are determined based on a position adjustment jig (not shown). The unit 50 together with the light-emitting device 22 mounted thereon can be positioned by such jig. Positioning is adjusted by, for example, aligning an optical axis of the light-emitting device 22 with an external optical device such as a lens, while the light-emitting device 22 of the light-emitting apparatus 52 is emitting light. The position adjustment means is used for adjusting the optical axis of the light emitted from the light-emitting device 22 of the light-emitting apparatus 52.

After the adjustment of the optical axis, the light-emitting apparatus 52 is fixed to a frame (not shown) for the light-emitting apparatus by fixing means. An adhesive may be employed as such fixing means. Alternatively, the light-emitting apparatus 52 may be fixed to the frame by inserting screws through holes 18 bored in the substrate 6 (FIG. 2).

Figure 5:
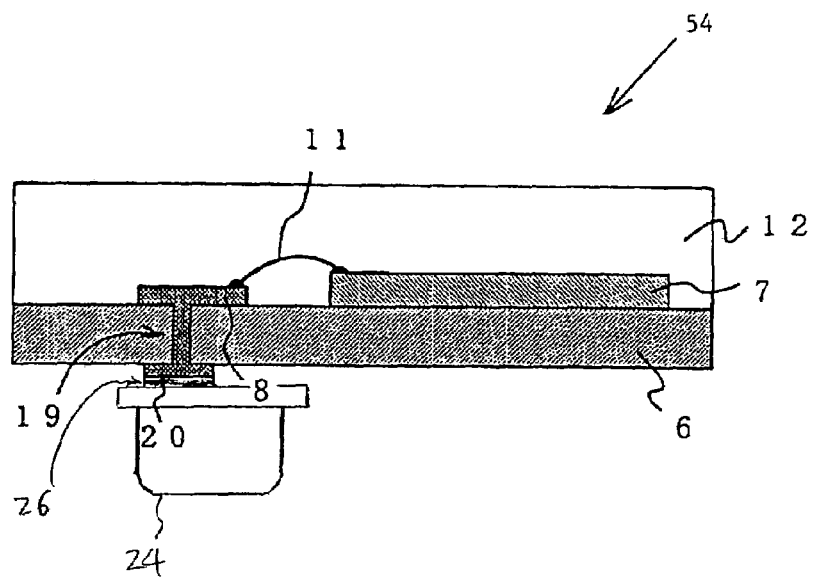
FIG. 5 is a cross-sectional view of a unit used for driving a light-emitting device according to a modified embodiment of the present invention.

In a modified embodiment shown in FIG. 5, a unit 54 has relay terminals 8 connected with pads 20 via through holes 19. The through holes 19 are bored through the substrate 6 and filled with an electrically conductive material. The pads 20 are connected with terminals of the light-emitting device 24. For example, such light-emitting device may be connected with and be fixed to the pads 20 by means of a solder, bumps, or anisotropic electrically conductive films. The light-emitting device of the surface mounting type can be easily mounted on the unit 54. All other features of the unit 54 except the features described above are the same as those of the unit 50 shown in FIGS. 2 through 4. In FIG. 5, the light-emitting device is connected with the pad by means of the anisotropic electrically conductive films 26.

An optical axis of the light-emitting device may be adjusted when the light-emitting device is mounted on the unit 54 in the modified embodiment. In such case, the optical axis is adjusted while light is emitted from the light-emitting device with the terminals of the light-emitting device being connected with the relay terminals 8 after fixing the unit 54 to the frame (not shown) for the light-emitting apparatus. The light-emitting device can be connected with and be fixed to the unit 54 by means of a solder or the like, after finishing the adjustment of the optical axis.

Figure 6:
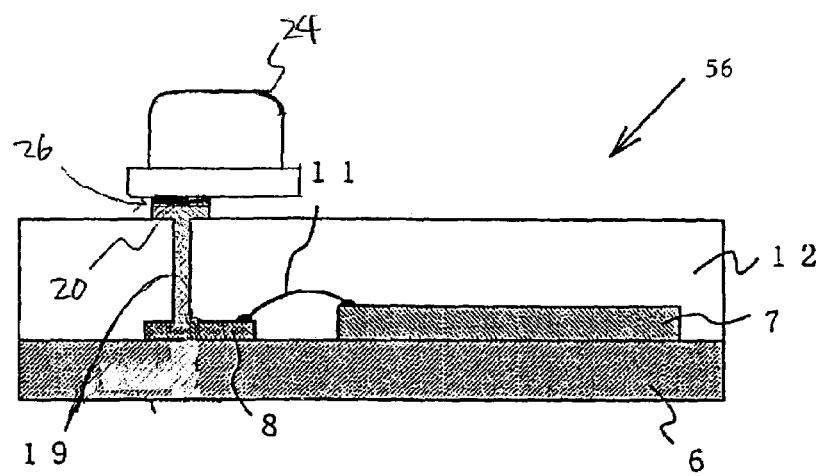
FIG. 6 is a cross-sectional view of a unit used for driving a light-emitting device according to another modified embodiment of the present invention.

It should be noted that although the through holes 19 for the relay terminals 8 are provided in the substrate 6 in FIG. 5, the through holes 19 may be alternatively provided in the molded resin layer 12 so as to expose the pads 20 on a surface of the molded resin layer 12. An example of a unit 56 is shown in FIG. 6. Similar reference numerals are used to designate similar parts and elements in FIGS. 2 to 6.

This application is based on a Japanese patent application No. 2002-196381 which is herein incorporated by reference.

What is claimed is:

1. A unit comprising:
a substrate having an upper face and a lower face;
an IC chip provided on the upper face of the substrate;
a relay terminal provided on the upper face of the substrate;
a connecting channel which connects the relay terminal with the IC chip to supply a driving current to the relay terminal from the IC chip;
a resin layer formed on the upper face of the substrate to enclose the IC chip and the relay terminal;
a through hole extending through the resin layer, relay terminal and the substrate; and
a light-emitting device provided on the resin layer, and having an elongated terminal which extends in the hole and reaches the relay terminal so that the light-emitting device can receive the drive current from the IC chip via the relay terminal.

2. The unit according to claim 1, wherein the connecting channel is wire-bonding.

3. The unit according to claim 1, wherein the relay terminal supports the terminal of the light-emitting device.

4. The unit according to claim 1, wherein the substrate includes position adjustment means.

5. The unit according to claim 4, wherein the position adjustment means is at least one notch provided at an edge of the substrate.

6. The unit according to claim 1, wherein the substrate includes at least one through hole for fixing.

7. A unit comprising:
a substrate having an upper face and a lower face;
an IC chip provided on the upper face of the substrate;
a relay terminal provided on the upper face of the substrate, the relay terminal having an extension;
a connecting channel which connects the relay terminal with the IC chip to supply a driving current to the relay terminal from the IC chip;
a resin layer formed on the upper face of the substrate to enclose the IC chip and the relay terminal;
a through hole extending through the resin layer, relay terminal and the substrate such that the extension of the relay terminal extends in the hole; and
a light-emitting device provided on the resin layer such that the light-emitting device is electrically connected to the extension of the relay terminal so as to receive the drive current from the IC chip via the relay terminal.

8. The unit according to claim 7 further including a pad between the light-emitting device and the resin layer.

9. The unit according to claim 7, wherein the light-emitting device has an elongated terminal that extends through the through hole and projects from the lower face of the substrate.

* * * * *